United States Patent [19]

Lipcon et al.

[11] Patent Number: 4,782,486
[45] Date of Patent: Nov. 1, 1988

[54] SELF-TESTING MEMORY

[75] Inventors: Jesse B. Lipcon, Harvard; Barry A. Maskas, Marlboro; David K. Morgan, Hopkinton, all of Mass.

[73] Assignee: Digital Equipment Corporation, Maynard, Mass.

[21] Appl. No.: 49,812

[22] Filed: May 14, 1987

[51] Int. Cl.[4] .......................................... G01R 31/28
[52] U.S. Cl. ...................................................... 371/21
[58] Field of Search ................... 371/21, 68; 364/200, 364/900

[56] References Cited

U.S. PATENT DOCUMENTS

| | | | |
|---|---|---|---|
| 3,351,905 | 11/1967 | Kramer | 371/21 |
| 3,517,174 | 6/1970 | Ossfeldt | 371/68 |
| 3,668,644 | 6/1972 | Looschen | 364/200 |
| 4,055,754 | 10/1977 | Chesley | 371/21 |
| 4,236,207 | 11/1980 | Rado et al. | 364/200 |
| 4,334,307 | 6/1982 | Bourgeois et al. | 371/16 |
| 4,369,511 | 1/1983 | Kimura et al. | 371/21 |
| 4,464,750 | 8/1984 | Tatematsu | 371/21 |
| 4,510,603 | 4/1985 | Catiller | 371/21 |
| 4,541,090 | 9/1985 | Shiragasawa | 371/21 |
| 4,584,663 | 4/1986 | Tanikawa | 364/900 |
| 4,608,690 | 8/1986 | Judge | 371/21 |
| 4,667,330 | 5/1987 | Kumagai | 371/21 X |
| 4,686,456 | 8/1987 | Furuyama et al. | 371/21 X |
| 4,697,233 | 9/1987 | Scheuneman et al. | 364/200 |
| 4,715,034 | 12/1987 | Jacobson | 371/21 |
| 4,719,411 | 1/1988 | Buehler | 371/21 X |

Primary Examiner—Charles E. Atkinson
Attorney, Agent, or Firm—Finnegan, Henderson Farabow, Garrett and Dunner

[57] ABSTRACT

A self-testing memory simultaneously writes test patterns into the memory banks of the memory, simultaneously compares the contents of one of the memory banks with the contents of the other of the banks, and records errors when the contents of the one memory bank differ from the contents of the other banks.

26 Claims, 12 Drawing Sheets

READ TIMING

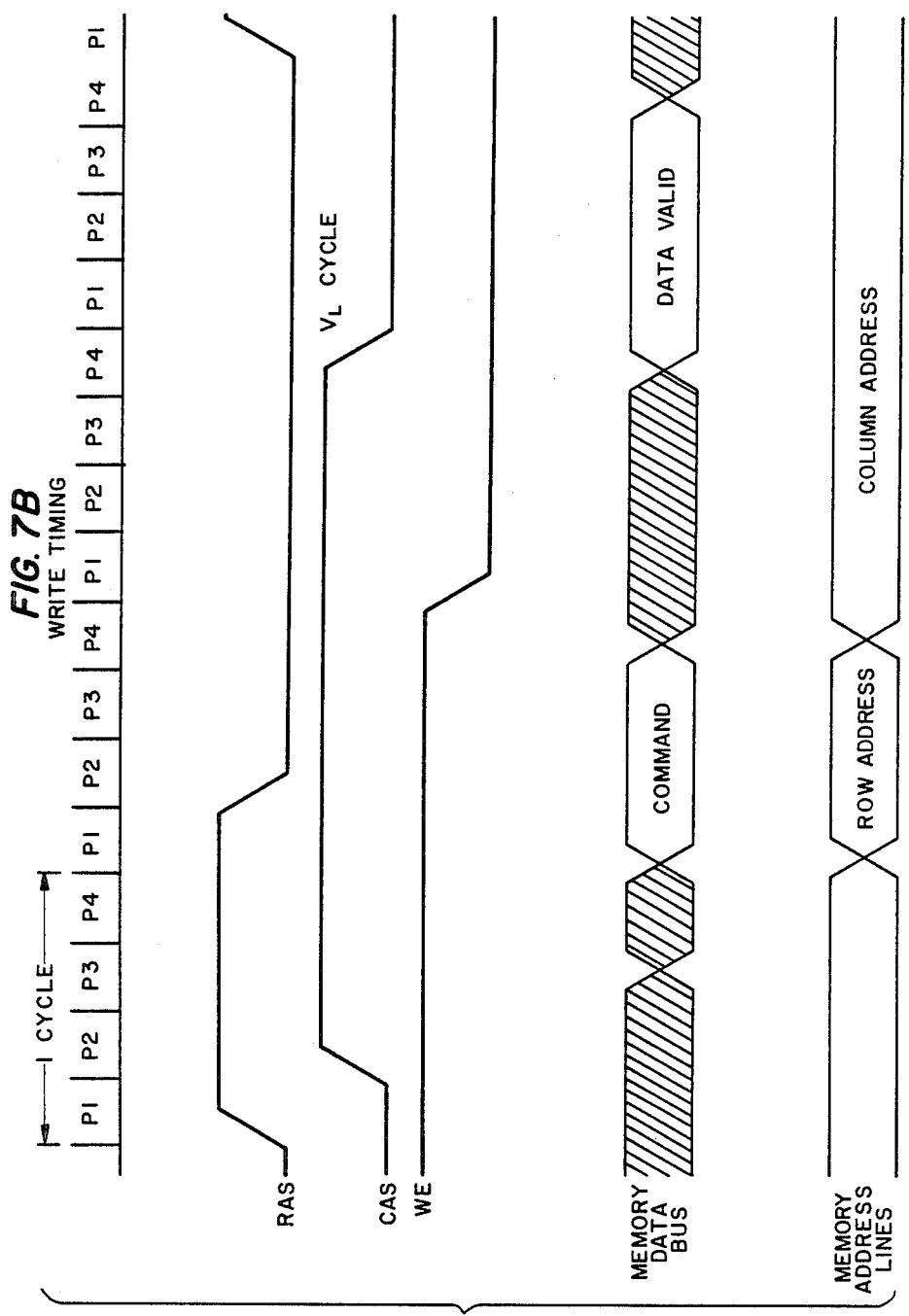

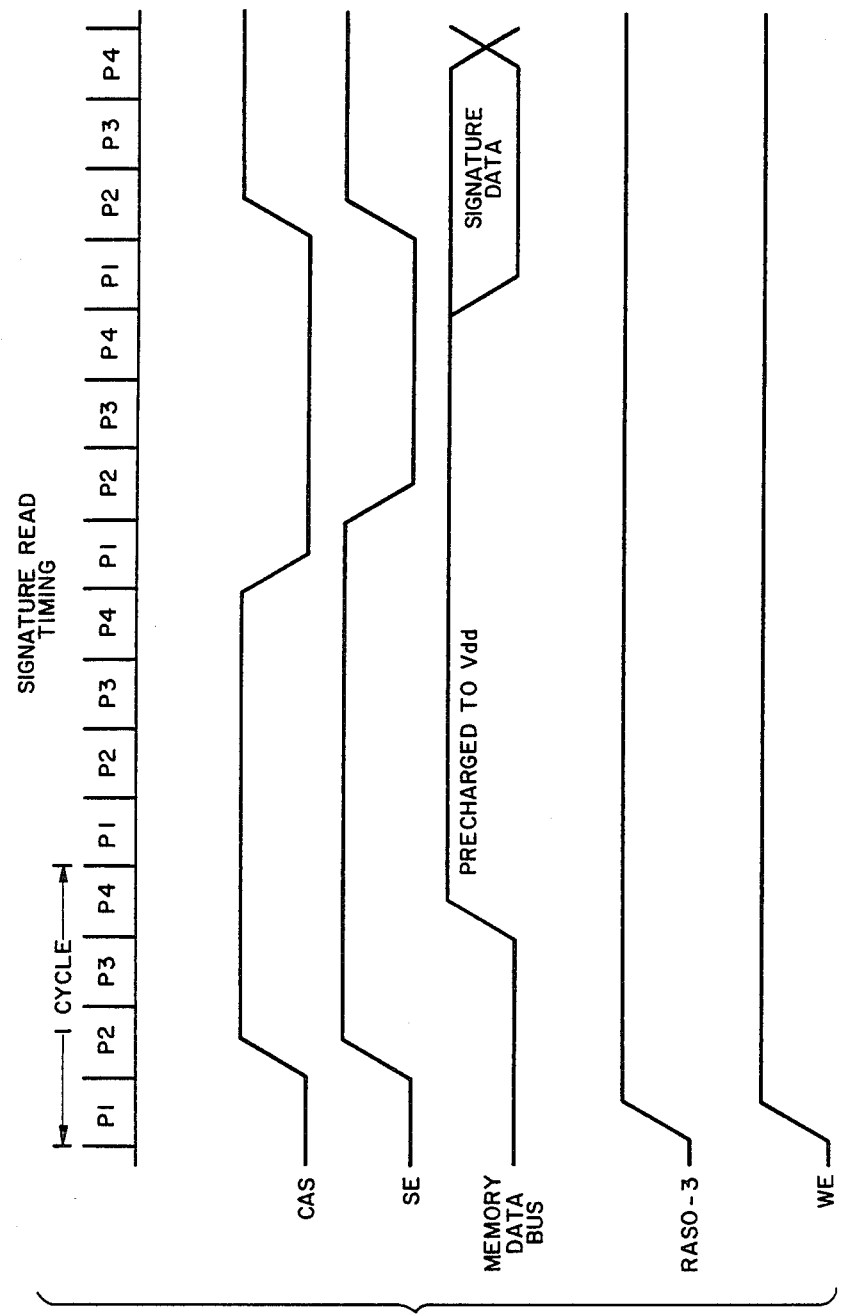

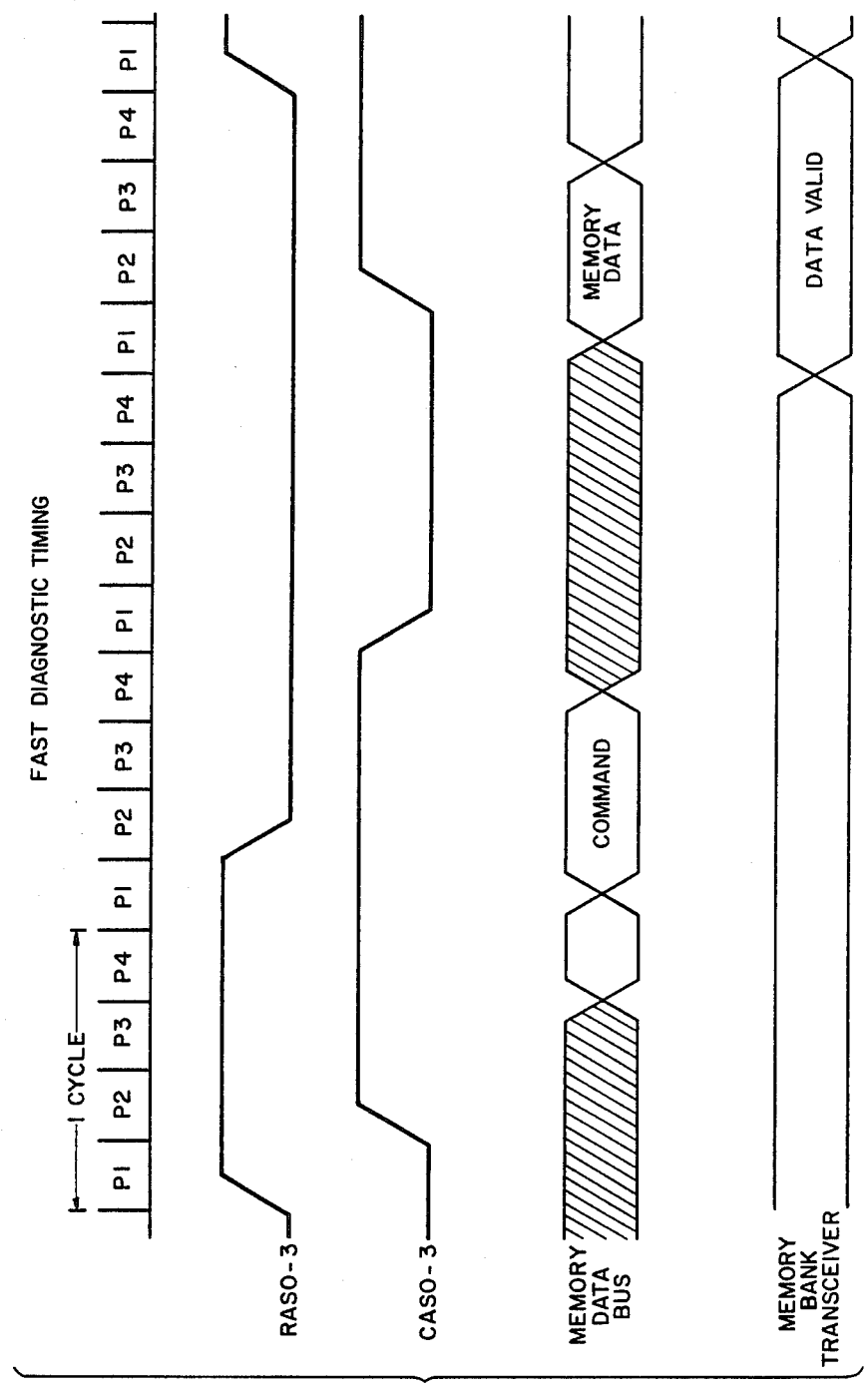

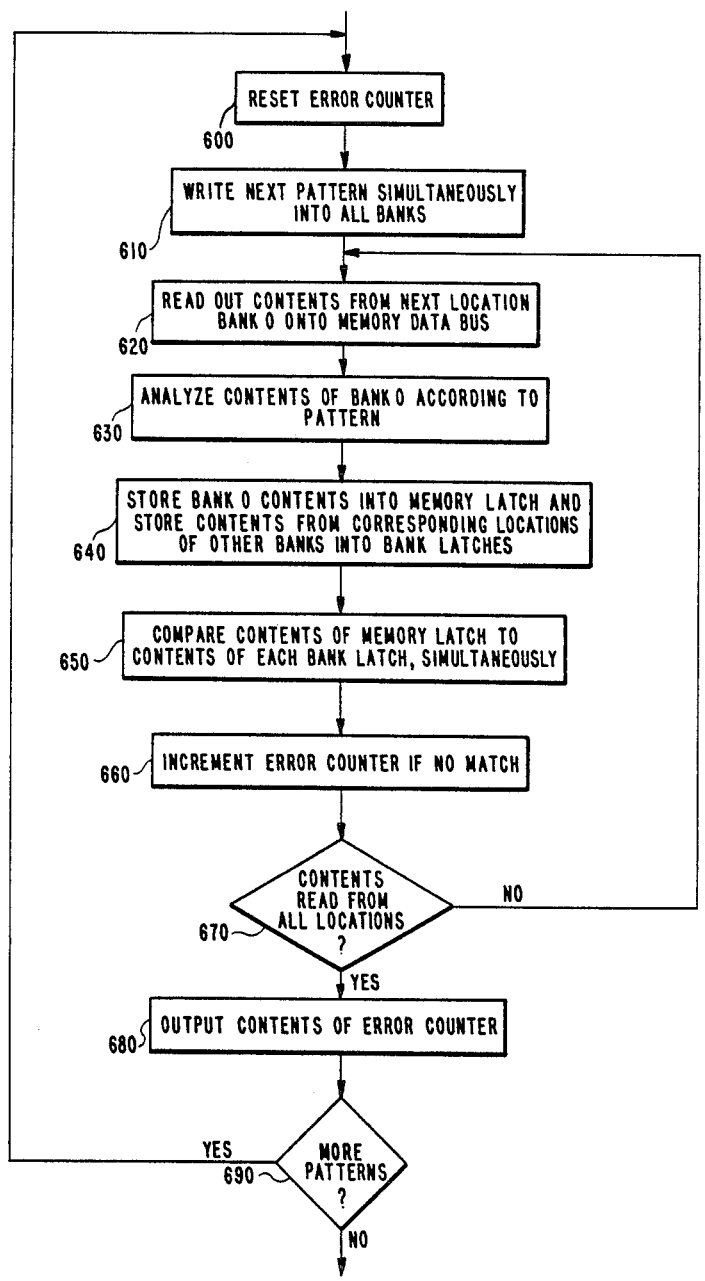

SELF-TESTING MEMORY

RELATED APPLICATIONS

This application is related to U.S. patent application Ser. No.07/049,816 by David K. Morgan entitled "Automatic Sizing Memory System."

II. BACKGROUND OF THE INVENTION

The present invention relates to the field of memories generally and specifically to the field of automatic testing of memories.

When a computer system is first turned on or rendered active from an inactive state, several tests must be performed to determine whether the computer system is operating correctly. One of these tests is a memory diagnostic program which ensures that the memory modules are correctly storing and retrieving information. There are many different types of memory diagnostic programs. A typical program will write predetermined patterns into each location in memory and then read the contents from these locations, to make sure that the patterns were correctly stored and retrieved in each location.

Such tests, however, can take a great deal of time to perform for all but very small memories. Furthermore, as the size of memory increases, so does the time needed to run the diagnostic program. Recently, memory size has been increasing by a factor of 4 every three years due to improvements in technology. Since memory cycle speeds have not increased accordingly, the increased memory sizes have caused corresponding increases in diagnostic times.

Conventional memory systems perform testing by writing and reading to the memory locations one at a time. Even for high speed systems, this can consume a great deal of time. For example, assuming a memory cycle time of 400 nanoseconds for a memory of 64 megabytes (16 megawords), to write and read only one pattern as part of a diagnostic program would take about thirteen seconds (400 nanoseconds * 16 megawords * 2 operations (read and write) per word).

The problem, however, is much more serious. Typically, diagnostic programs require the use of more than one pattern to sufficiently test a memory. For example, if a memory cell is defective because it always produces a "1" output regardless of what data value was stored, then, on the average, half of the patterns used for testing would not catch this defect.

To provide for more complete testing, memory diagnostic programs involve several different patterns. For example, to run a simple test that uses a pattern formed by shifting a "1" in a field of zeros through each bit position in a 32 bit data word in the 64 megabyte memory system described above would take almost seven minutes (32 tests * 13 seconds/test) to complete.

Present systems must therefore choose between consuming several minutes for the memory test or foregoing a full test of the memory. Neither alternative is acceptable.

Accordingly, it is an object of the present invention to provide a memory that can perform self-testing procedures faster than conventional methods.

It is also an object of the present invention to perform automatic testing of memory quickly, but without requiring substantial numbers of additional components.

Additional objects and advantages of the present invention will be set forth in part in the description that follows and in part will be obvious from that description or may be learned from the practice of the invention.

III. SUMMARY OF THE INVENTION

The present invention achieves its objects and attains its advantages by simultaneously writing test patterns into corresponding locations of several banks on a board, and simultaneously reading out the contents of those locations to compare them to a predetermined bank.

More particularly, to achieve the objects in accordance with the purpose of this invention, as embodied and as is broadly described herein, a self-testing memory of this invention, which is composed of a plurality of memory banks, comprises means for simultaneously writing test patterns into each, of the plurality of memory banks; means for selecting one of the memory banks; means for simultaneously comparing the contents of the selected one of the memory banks with the contents of the others of the memory banks; and means for recording, as errors, occurrences when the contents of the locations of one of the memory banks are different from the contents of corresponding locations of the others of the memory banks.

The accompanying drawings, which are incorporated in and constitute a part of this specification, illustrate an embodiment of this invention, and together with the description, serve to explain the principles of the invention.

IV. BRIEF DESCRIPTION OF THE DRAWINGS

FIG. 7B is a timing diagram for a write operation using the data processing system shown in FIG. 1;

FIG. 7C is a timing diagram for a signature read operation;

FIG. 7D is a timing diagram for a fast diagnostic testing operation;

FIG. 9 is a flow diagram for the fast diagnostic test operation.

V. DETAILED DESCRIPTION OF THE PREFERRED EMBODIMENT

Reference will now be made in detail to a preferred embodiment of the present invention, an example of which is shown in the accompanying drawings.

A. General System and Automatic Memory Sizing Apparatus

Figure 1:
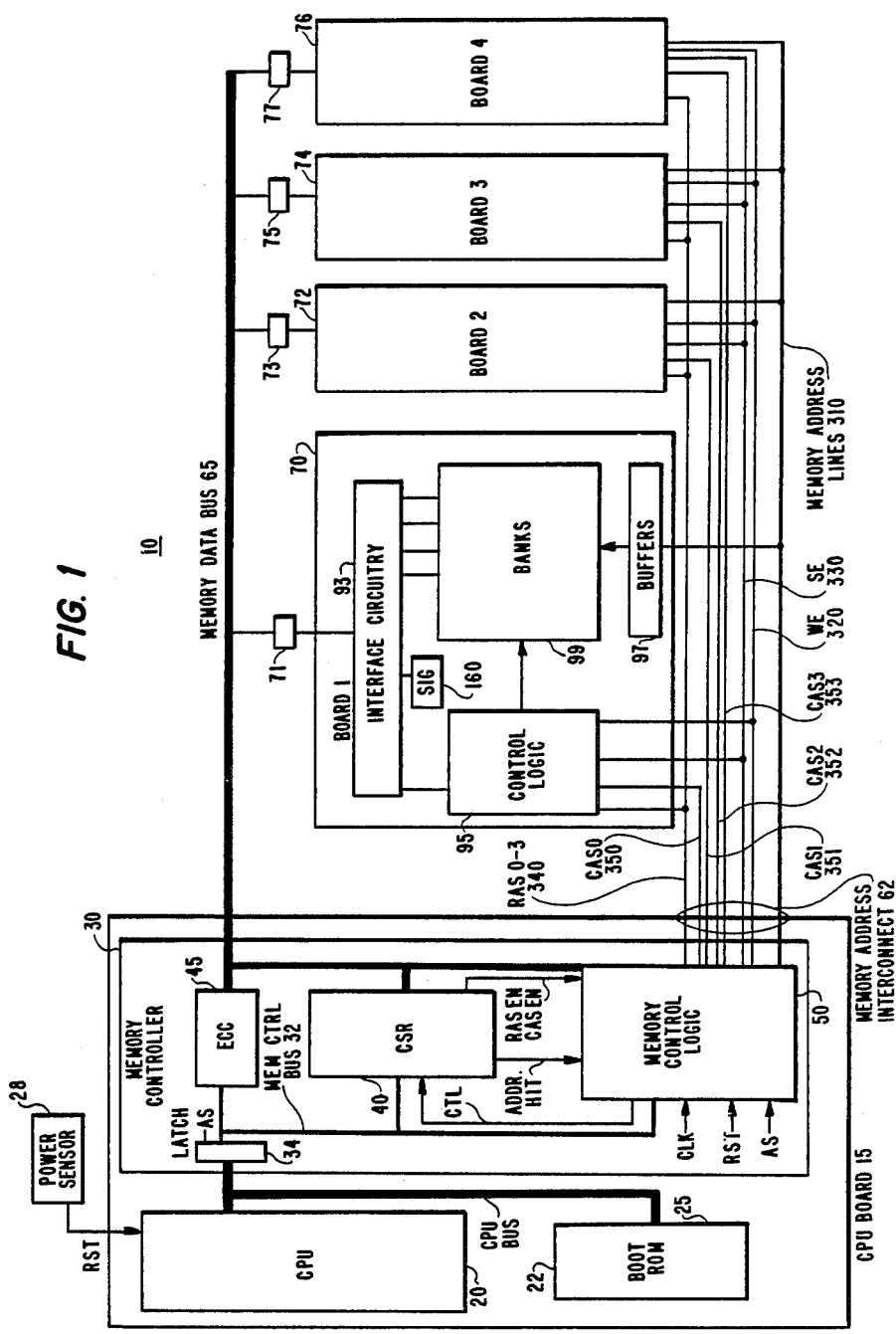
FIG. 1 is a block diagram of a data processing system incorporating a preferred embodiment of this invention.

FIG. 1 shows a data processing system 10 which provides automatic memory sizing and fast memory testing. As FIG. 1 shows, in its preferred embodiment, data processing system 10 includes a CPU board 15 and memory boards 70, 72, 74, and 76. The specific arrangement of boards shown in FIG. 1, however, is incidental to the present invention.

Data processing system 10 includes a central processing unit, such as CPU 20 located on CPU board 15. CPU 20 is capable of executing instructions to carry out the present invention. A CPU bus 22 carries commands, address, and data from CPU 20 and also delivers data to CPU 20.

The data processing system also includes booting means, coupled to the central processing unit, for causing the central processing unit to institute memory initialization procedures, including the generation of commands and addresses. The preferred embodiment data processing system 10 includes Boot ROM 25 on CPU board 15. Boot ROM 25 is a read only memory containing programs for bootstrap or initialization procedures. Among the programs stored in Boot ROM 25 are programs for initialization, such as programs to control the operations necessary for the automatic memory sizing and fast memory test procedures. Of course, Boot ROM 25 can also include other programs and procedures.

The present embodiment can also include means for sensing an initialization condition to cause the central processing unit to begin the initialization program. As shown in the preferred embodiment in FIG. 1, a power sensor 28 detects when electrical power is provided to data processing system 10 in order to initiate bootstrap operations. The output of circuit 28, after passing through synchronization circuitry not important to an understanding of the present embodiment, generates a reset (RST) signal for various components of data processing system 10 which take specific actions at times of initialization. For example, in the preferred embodiment CPU 20 sends a starting address to Boot ROM 25 in response to the RST signal. A starting address begins an initialization program stored in Boot ROM 25 which causes CPU 20 to carry out procedures for automatic memory sizing. The RST signal can also be generated from the detetion of other conditions.

The data processing system also includes a memory system, coupled to the central processing unit, which is responsive to the initialization procedures carried out by the central processing unit. Such a system in FIG. 1 includes mmory controller 30 and memory boards 70, 72, 74, and 76.

The memory includes memory controller means for constructing a configuration table representing the arrangement of storage locations in the memory system and for forming memory addresses and memory select signals from the addresses and commands received from the central processing unit. In the preferred embodiment shown in FIG. 1, memory controller 30 on CPU board 15 performs the functions of the memory controller means. Memory controller 30 includes a latch a 34, a configuration status register 40, memory control logic 50, and an error detection and correction unit 45. Memory controller 30 receives addresses and commands from CPU 20 over CPU bus 22. In particular, an AS signal controls latch 34 to transfer an address from CPU bus 22 to a memory controller bus 32 in memory controller 30. Memory controller 30 then processes those addresses and commands and forms memory addresses and memory select signals (e.g., signals 310, 320, 330, 340, and 350-353 shown in FIG. 1).

The memory controller means also includes configuration register means for forming a configuration structure according to configuration data which is descriptive of the configuration of the memory system. An example of such configuration register means is configuration status register (CSR) 40 which is part of memory controller 30. Configuration data, which is also called "signature data," is described in more detail below. Generally, such data describes certain characteristics of a memory module, such as size or number of banks.

Figure 2:
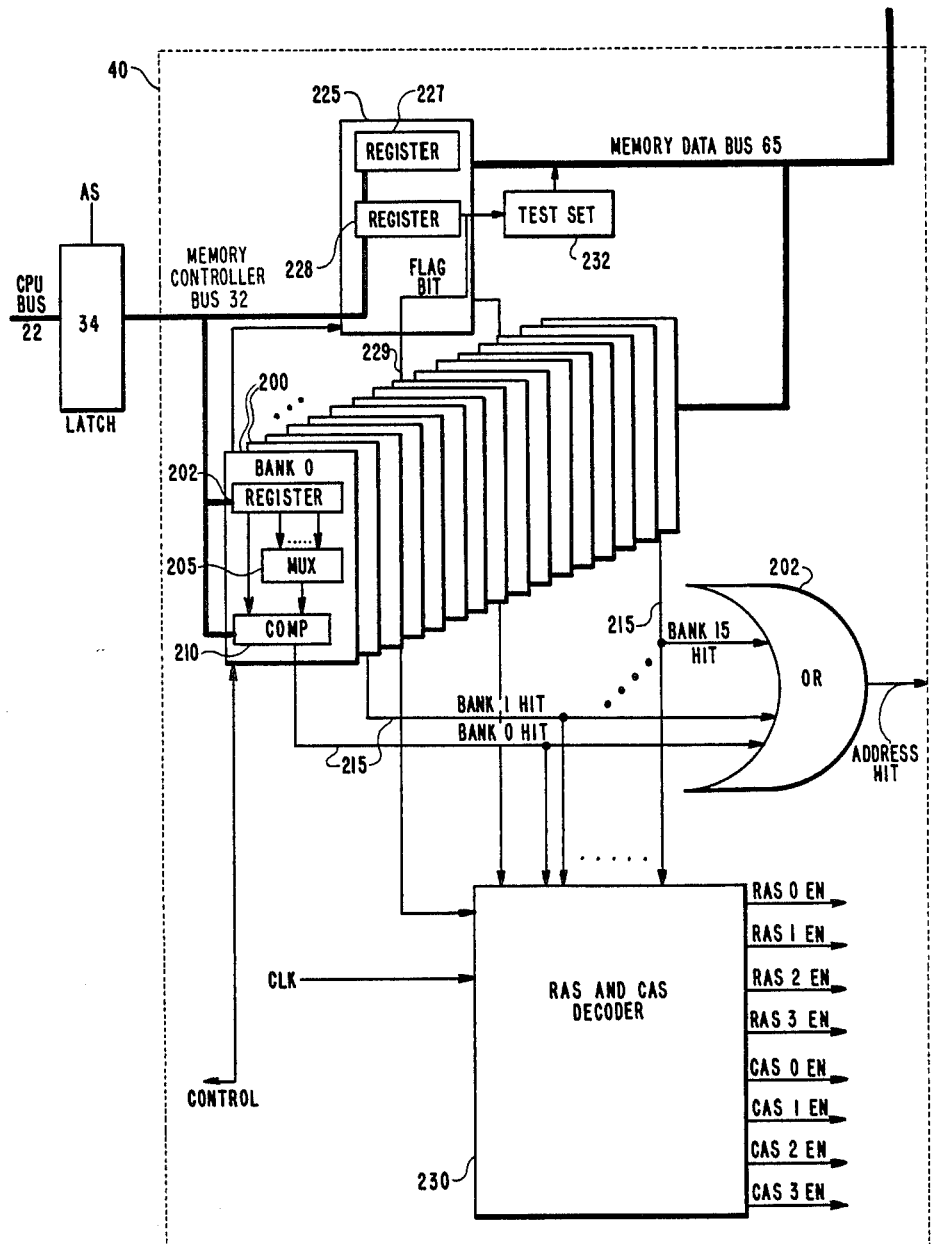
FIG. 2 is a block diagram of a preferred embodiment of a configuration status register 40 shown in FIG. 1.

FIG. 2 shows the preferred embodiment of configuration status register 40 in greater detail. CSR 40 includes several bank status register circuits 200, an OR GATE 220, and a RAS and CAS Decoder 230. In the preferred embodiment of the present invention, each memory board includes a number of individual banks of memory, and CSR 40 includes a separate bank status register circuit 200 for each bank of memory.

Bank status register circuits 200 each include a configuration register 202, a multiplexer 205, and a comparator 210. Each configuration register 202 contains configuration data about the memory bank corresponding to the bank status register circuit containing that configuration register. Bank status register circuits 200 cumulatively represent the configuration structure of the entire memory.

Figure 3:
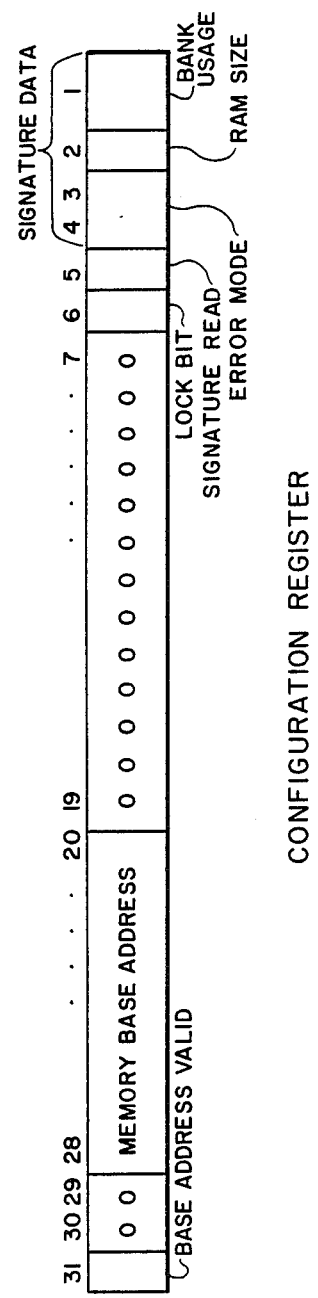
FIG. 3 is a diagram showing the format of data stored in a configuration register 202 shown in FIG. 2.

FIG. 3 shows an example of the contents of one configuration register 202, with the numerals across the top of FIG. 3 indicating bit position numbers. The information stored in each configuration register 202 is received either from a memory data bus 65 or from the CPU 20 by way of memory controller bus 32, latch 34, and CPU bus 22. Control signals from memory control logic 50 cause register 202 to store the received information. As shown in FIG. 3, the contents of each configuration register 202 include a number of fields. One of the fields is the base memory address for the corresponding memory bank. The base memory address of a memory bank is the address for that bank. CPU 20, under control of Boot ROM 25, calculates the base memory address for each bank based on the address and size information of the other memory banks. The specific process used by CPU 20 in the preferred embodiment is explained in more detail below.

After computing a base memory address, CPU 20 then stores it in the appropriate configuration register 202 by way of CPU bus 22, latch 34, and memory controller bus 32. When the CPU 20 stores a base memory address into a corresponding configuration register 202, it also sets a validity bit for that register, as shown in FIG. 3, to indicate that the corresponding base memory address is valid.

Another field in configuration register 202 is a lock bit. Although the function of this bit is not directly relevant to the present invention, it is described briefly for purposes of completeness. The lock bit is set during an exclusive read-modified-write operation to a memory bank to preserve data integrity.

The next field is a signature read bit. CPU 20 sets this bit to cause memory controller 30 and memory boards 70, 72, 74, and 76 to initiate certain procedures necessary for storing the signature or configuration data of the corresponding memory bank into the remaining field of configuration register 202.

That remaining field is the signature or configuration data for the corresponding memory bank. That signature data, which comprises five bits of information, is obtained from the low order five lines of memory data bus 65 during a configuration data read operation. The configuration data field shown in FIG. 3 includes three subfields: an error subfield, a size subfield, and a use subfield. For the reasons discussed below, the configuration data in the preferred embodiment is the same for all the memory banks on a memory board.

The error subfield is two bits wide and identifies the type of error correction or detection which is being performed for the corresponding, bank. In the preferred embodiment, error correction and detection can be absent or, if present, can be either single bit parity or a seven bit error correcting code. Of course, there is no limitation on the type of error correction that can be used in accordance with the present invention, nor is there any requirement that error correction be used at all. The error correction in the preferred embodiment is the same for each bank on a board, thus the configuration register 202 for all the banks on each board will have the same values in the error subfield.

The size subfield is one bit wide and identifies the size of the corresponding bank as either 1M words or 256K words in the preferred embodiment. In the preferred embodiment, words are four bytes long. In the preferred embodiment, all of the banks on each board have the same size, so each configuration register 202 for the memory banks on the same board has the same values for the size subfield. Identically-sized banks on a board, however, is not a requirement for all embodiments of the present invention.

The bank use subfield is a two-bit subfield specifying the number of memory banks on the board containing the corresponding memory bank. The two-bit subfield in the preferred embodiment identifies the size as either zero banks (absent board), one bank, two banks or four banks.

Preferably, bank status register circuits, 200 in configuration status register 40 are each identical, as shown in FIG. 2, but they need not be. For example, they can differ if needed to reflect different bank requirements.

In addition to bank status register circuits 200, configuration status register 40 can have additional status register circuits, such as status register circuit 225 containing status register 228, to perform operational management. For example, in the preferred embodiment, CPU 20 performs fast diagnostic tests by setting a bit in status register circuit 225, as explained in detail below.

In the preferred embodiment of control status register 40, additional elements are associated with each of the bank status register circuits 200. These elements, which are shown in FIG. 2, include multiplexer 205 and comparator 210. Although only one set of these elements is shown, it should be understood that in the preferred embodiment, each bank status register circuit 200 would have its own multiplexer 205 and comparator 210.

In the preferred embodiment of bank status register circuit 200, a comparator 210 compares the base address information for that bank status register, which is received via multiplexer 205, with addresses on memory controller bus 32 which have been received from CPU 20. If banks on a board each have 1M words, and assuming that the base addresses for those banks are multiples of 1M, memory addresses for locations in that bank share the same high order bits. The same holds true if a bank has 256K words. The difference in situations is that for an address of a given number of bits, there is a greater number of common bits for the smaller size banks than for the larger size. Thus, to ensure that comparator 210 is comparing the correct number of address bits for each memory size, multiplexer 205 has as inputs both the high order address bits for 1M word memories and high order address bits for 265K word memories. Multiplexer 205 selects one of those inputs in response to the size subfield.

Comparator 210 the selected portions of the base memory address for that bank and the addresses on memory controller bus 32, and enables a corresponding bank hit signal 215 when the address portions on controller bus 32 equal the base memory address N portion in status register 202. When the bank bit signal is enabled, it means that the memory addresses are within the address space for the corresponding bank. The comparators 210 in each of the bank status register circuits 200 perform similar comparisons simultaneously and enable their own bank hit signals when the addresses from CPU 20 are within the address space of the corresponding bank. As is apparent, at most one bank hit signal is enabled for a single address.

All the bank hit signals 215 are inputs both to OR GATE 220 and to RAS and CAS Decoder 230. OR GATE 220 produces an address hit signal if any of the bank hit signals 215 is enabled. An enabled address hit signal indicates that the address from the CPU 20 is within the address space of the associated memory. Sometimes addresses will be outside of that address space, such as to access one of the status register circuits. In this case, none of the bank hit signals will be enabled.

The bank hit signals are also used by RAS and CAS Decoder 230 to enable the appropriate RAS EN and CAS EN signals. When enabled, the RAS EN signals and CAS EN signals assume a level which is then used to generate the row address strobe (RAS) and column address strobe (CAS) that activate a corresponding bank of the memory. Each bank of the memory is selected by a different combination of one RAS and one CAS. The RAS EN and CAS en signals are outputs of configuration status register 40, as is the address hit signal and other signals which are either discussed below or are not relevant to an understanding of the present invention.

The memory controller means also includes control logic for forming the memory addresses and memory select signals from the addresses and commands received from the central processing unit and from the configuration structure in the configuration register means. An example of such control logic is shown in FIG. 1 as control logic circuit 50. Control logic circuit 50 is shown in greater detail in FIG. 4.

Control logic circuit 50 receives several signals from configuration status register 40, including the address hit signal, the RAS EN signals, and the CAS EN signals. In addition, control logic 50 receives clock signals, the AS signal, and the RST signal, and is coupled to memory controller bus 32. Memory control logic 50 also produces the signals constituting memory address interconnect 62.

Figure 4:
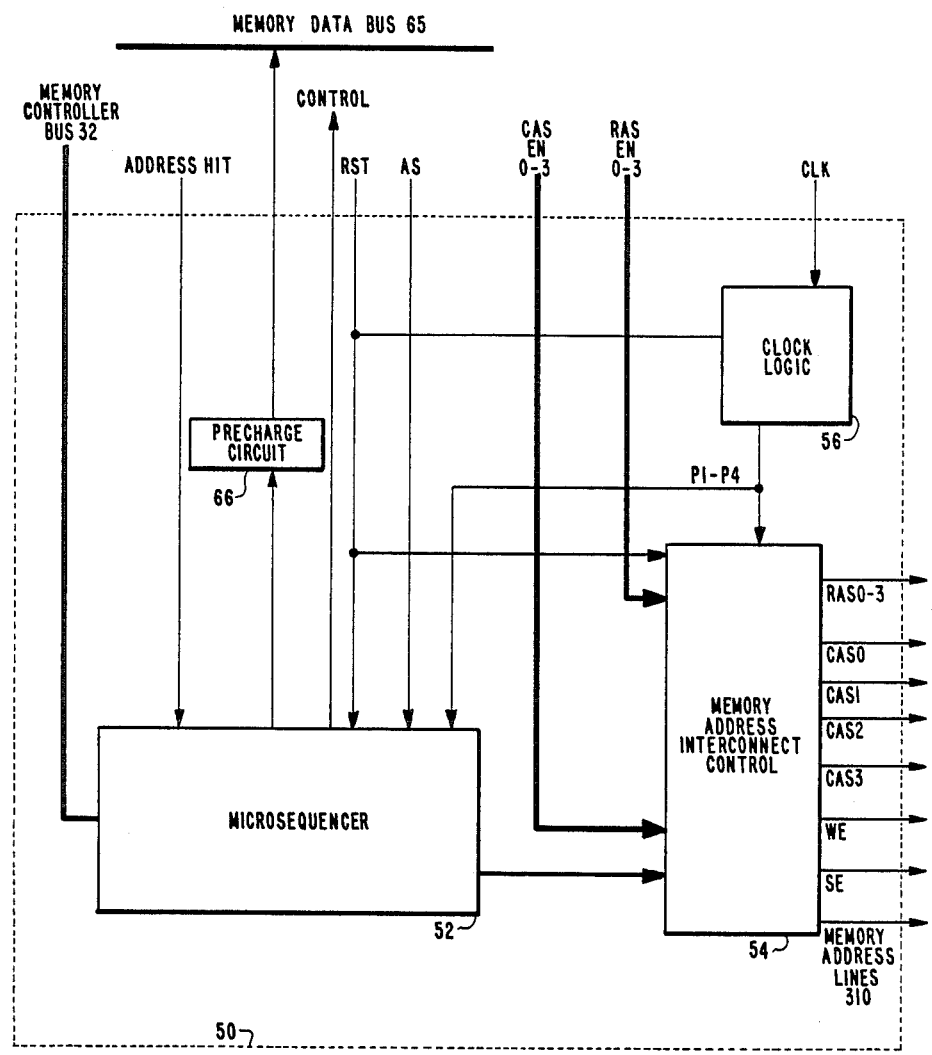
FIG. 4 is a block diagram of a preferred embodiment of the memory control logic 50 shown in FIG. 1.

As shown in FIGS. 1 and 4, memory address interconnect 62 includes: 10-bit memory address lines 310, which specify one of the address locations within each bank; signals CAS0-CAS3 (350-353), which are formed from the correponding CAS signals and clock signals; signals RAS0-3 (340), which are formed from the corresponding RAS signals and clock signals; the SE (signature enable) signal; and the WE (write enable) signal.

Generally, CAS0-CAS3 are mutually exclusive, as are RAS0-3, except as described below for testing. CAS0-CAS3 each correspond to a different memory board, and RAS0-3 each correspond to one of the banks on each memory board. The SE signal causes a read of the signature or configuration data, and the WE signal causes the memory bank designated by RAS0-3 and the board designated by CAS0-CAS3 to write data from memory data bus 65 into a location specified by the memory address lines 310. Memory address lines 310 also specify a location in a bank from which data is transferred to memory data bus 65 during a read operation.

As shown in FIG. 4, memory control logic 50 includes a microsequencer 52, memory address interconnect control 54, clock logic 56, and precharge circuitry 66. Other elements, such as buffering circuits, are omitted from the description of preferred embodiments for simplicity and because the implementation of these elements is within the level of ordinary skill. Clock logic 56 receives system clock signals (CLK) and provides internal clock signals to microsequencer 52 and to memory address interconnect control 54. Preferably, such internal clock signals, designated in FIG. 4 as P1-P4 correspond to subcycles of the main cycles of data processing system 10. Memory address interconnect control 54 uses the internal clock signals to add the appropriate timing to the RAS EN and CAS EN signals to form the RAS0-3 and the CAS0-CAS3 signals. The RAS0-3 signals are four separate signals, as are CAS0-CAS3. Memory address interconnect control 54 adds such timing in response to control signals from microsequencer 52.

The functions of microsequencer 52 include advising interconnect control 54 of the cycle during which the CAS0-CAS3, RAS0-3 memory address lines 310, SE, and WE should be enabled. In response, control 54 enables and disables those signals during the proper subcycles. Microsequencer 52 also receives commands and data from CPU 20 via memory controller bus 32, as well as the AS signal, indicating that CPU 20 has sent such commands and addresses, and receives the address hit signal from CSR 40, indicating that the address from CPU 20 is within the memory's address space. In addition, microsequencer 52 sends control signals to CSR 40, for example to cause the storage of data into registers 202. Other functions of microsequencer 52 will become apparent from a description of the methods of this invention.

The memory system also includes a memory bus, coupled to the memory controller means and carrying memory data, memory addresses, and memory select signals. Such a memory bus can, in the preferred embodiment, include both address interconnect 62 and memory data bus 65. Preferably, memory data bus 65 is on a backplane of a computer structure and memory boards 70, 72, 74, and 76, as well as CPU board 15, plug into that backplane by way of connectors. Connectors 71, 73, 75, and 77, corresponding respectively to boards 70, 72, 74, and 76, are shown in FIG. 1.

The memory system also includes memory modules coupled to the memory bus. Memory boards 70, 72, 74, and 76 are such memory modules in the preferred embodiment.

The memory modules include storage means, coupled to the memory bus and having one of several configurations, for storing memory data to and for retrieving stored memory data from different locations corresponding to the memory addresses on the memory bus. In the preferred embodiment shown in FIG. 1, memory banks 99, which can be organized into as many as four banks per board, perform the functions of such a storage means.

Figure 5:
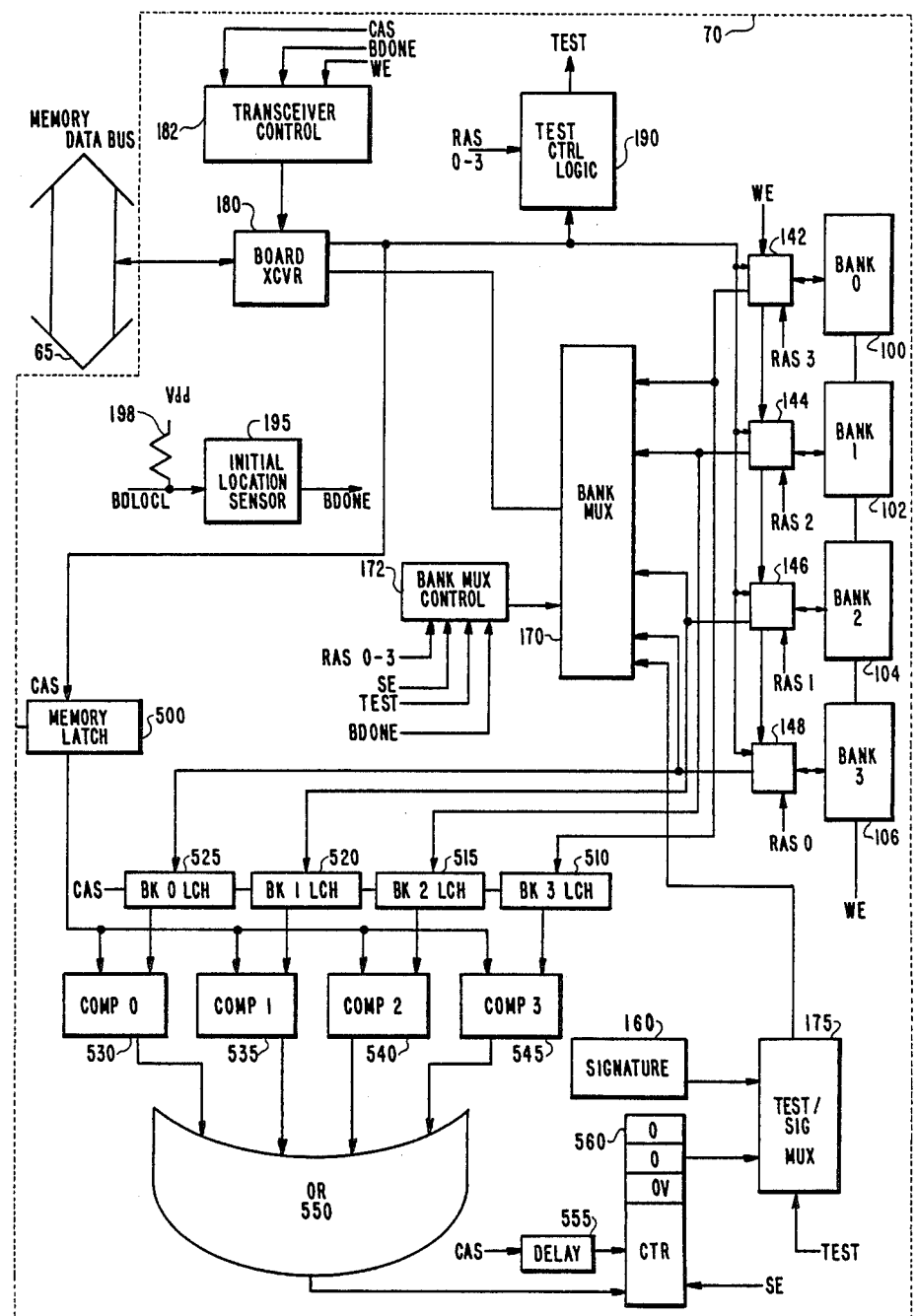
FIG. 5 is a block diagram of a preferred embodiment of certain circuitry on Board 1 in FIG. 1.

FIG. 5 shows a system diagram with certain elements of memory board 70, including elements of control logic 95 and interface circuitry 93 (shown in FIG. 1). Memory board 70 preferably includes four memory banks, 100, 102, 104, and 106, which are collectively equivalent to memory banks 99 in FIG. 1. The connections between bank 100 and other elements of memory board 70 are shown in greater detail in FIG. 6.

Figure 6:
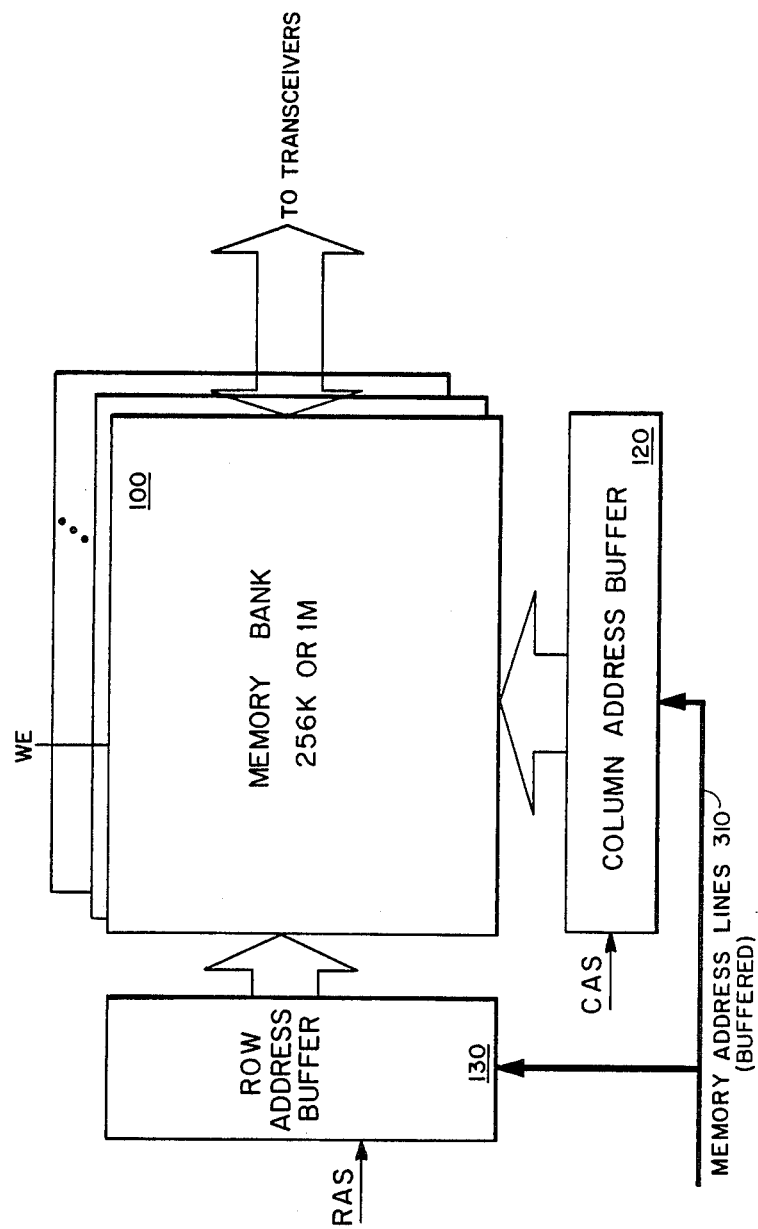
FIG. 6 is a preferred embodiment of memory bank 100 shown in FIG. 5 and of associated buffer circuitry.

As shown in FIG. 6, bank 100 includes a memory array of 256K or 1M words which act as a storage means. In the preferred embodiment, bank 100 provides storage of 32 bit words and an error detection and correction code of up to 7 bits. Preferably, as illustrated in FIG. 6, bank 100 is organized either as 39 parallel 1 bit by 256K memories or as 39 parallel 1 bit by 1M memories.

Memory bank 100 is coupled to a column address buffer 120, which is shared by all the banks on memory board 70, and a row address buffer 130, which is unique to bank 100. Prior to being latched into buffers 120 and 130, the memory address lines pass through buffers 97, shown in FIG. 1. The RAS and CAS for band 100 pass through buffers in control logic 95, also shown in FIG. 1. Each of the buffers 120 and 130 is capable of holding 10 address bits. The 20 total address bits are sufficient for addressing each location in up to 1M words of memory. Up to ten-bits of memory addresses from memory address lines 310 are latched into row address buffer 130 during assertion of the corresponding RAS signal, and up to ten-bits of memory addresses are latched into column address buffer 120 during assertion of the corresponding CAS signal.

Figure 7A:
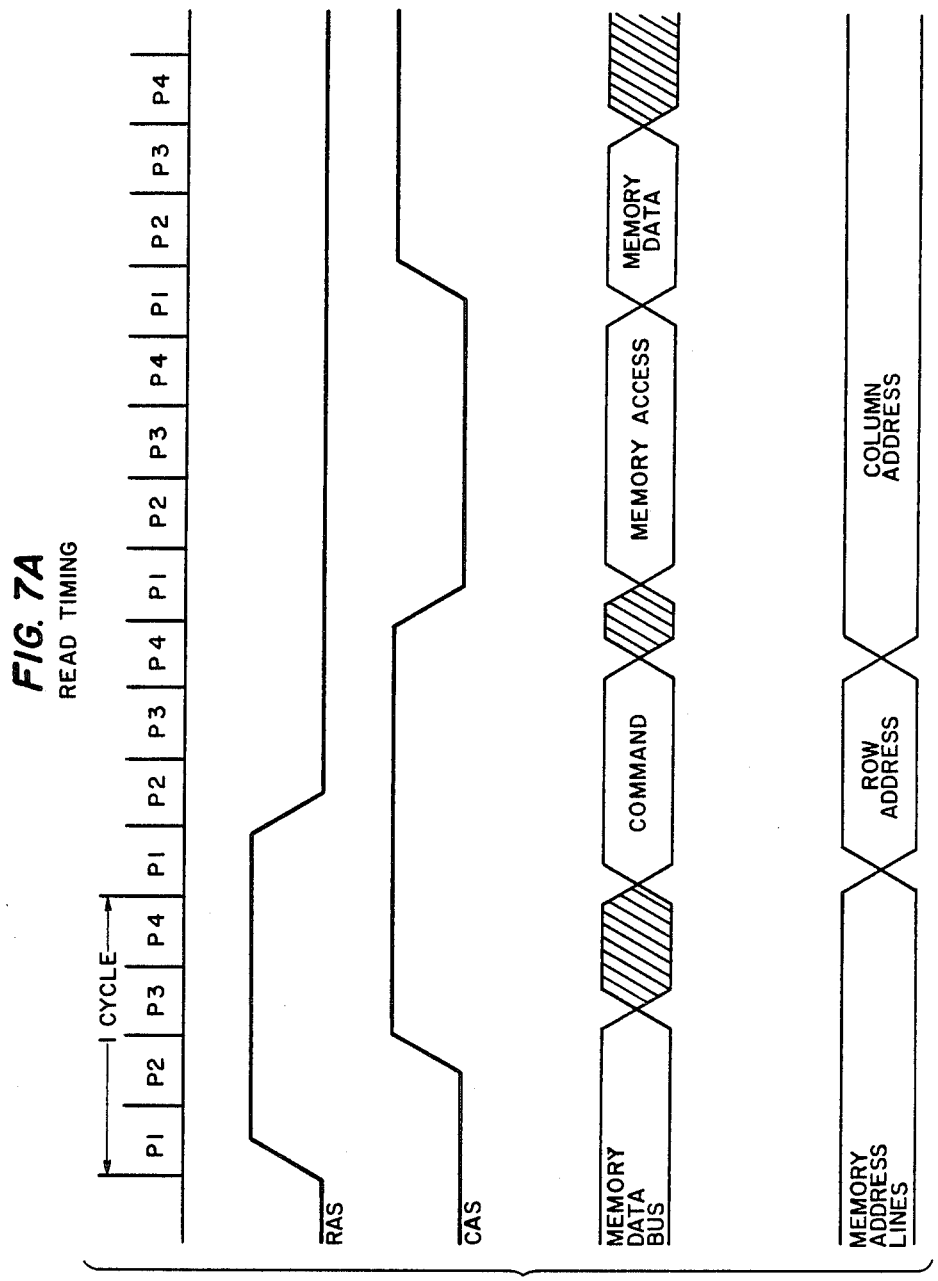
FIG. 7A is a timing diagram for performing a read operation in the data processing system of FIG. 1.

The timing of the RAS and CAS in relationship to the memory address lines and memory data bus is shown in FIG. 7A for a single transfer read operation (no errors), and is shown in FIG. 7B for a single transfer write operation (no errors). Multiple transfer read and write operations are similar but involve toggling the CAS signal as the column address changes.

As FIG. 7A shows, consistent with the description just provided for read operations, the row address signals are valid on memory address lines 310 during assertion of the RAS and the column address signals are valid on memory address lines 310 during assertion of the CAS. Data from the read operation is available on memory data bus 65 for part of the time that the CAS is asserted and when the CAS is deasserted.

As FIG. 7B shows, the timing of the assertion of the RAS and CAS is the same for read and write operations, but the durations of those signals are different. The WE signal is asserted before the data on memory data bus 65 becomes valid and is deasserted after that data is no longer invalid. Data is written when the appropriate CAS is asserted.

As shown in FIG. 5, associated with each bank is a bank transceiver. Thus bank transceivers 142, 144, 146, and 148 correspond respectively to memory banks 100, 102, 104, and 106. The direction of data flow through transceivers 142, 144, 146, and 148 is controlled by the WE signal.

The memory boards also include signature means for storing configuration data identifying the configuration of the storage means. In the preferred embodiment of memory board 70 shown in FIG. 5, signature register 160 holds configuration data for the corresponding memory banks on memory board 70. Preferably, the signature register is a set of pins which are connected to voltage sources representing either "1" or a "0" levels. As explained above, the memory banks on one memory board of this embodiment share the same five bits of configuration data because the sizes of the memory banks on each board must be the same, and all memory banks must use the same error correction and detection scheme. Thus, a single signature register can suffice to provide configuration data for each memory bank on memory board 70. The present invention, however, is not limited to this embodiment and it is also possible to provide a signature register for each bank if the configuration data for each bank can be different.

Signature register 160 is preferably a five bit words. The first two bits specify the error detection scheme (1 bit parity, 7 bit error correction, or no error detection at all), the second two bits specify the number of banks (1, 2, or 4), and the last bit specifies whether the banks are 256K words or 1M words.

The memory boards also include multiplexer means, coupled to the storage means and signature means, for placing, when activated, either the memory data or the configuration data onto the memory bus in response to multiplex control signals. In the preferred embodiment, interface circuitry 93, shown in FIG. 1, provide such means. Certain of the elements of interface circuitry 93 are shown more completely in FIG. 5 as a bank multiplexer 170 and a test/sig multiplexer 175. Other elements in FIG. 5 are part of control logic 95 or represent the other elements of board 70 shown in FIG. 1.

Bank multiplexer 170 has inputs coupled to the outputs of bank transceivers 142, 144, 146 and 148, and can select one of those outputs as an input to board transceiver 180. Bank multiplexer 170 also has an input coupled to the output of test/sig multiplexer 175 and can instead select that output as an input to board transceiver 180. One of the inputs to test/sig multiplexer 175 is signature register 160. Test/sig multiplexer 175 gates the contents of signature register 160 as an input to bank multiplexer 170 when the TEST signal is disabled. The generation of the TEST signal is described in detail below.

Bank multiplexer 170 is controlled by bank multiplexer control circuit 172, which has as inputs RAS-0-RAS3, the SE signal, the TEST signal, and a BDONE signal also described in more detail below. In response to bank multiplexer control circuit 172, bank multiplexer 170 selects either the outputs of one of the bank transceivers 142, 144, 146 and 148, or the output of test/sig multiplexer 175. The selected output is then sent onto memory data bus 65 through board transceiver 180.

Board transceiver 180, as shown in FIG. 5, not only controls the transfer of data onto memory data bus 65 from bank multiplexer 170, it also controls the transfer of information from memory data bus 65 to the banks 100, 102, 104, and 106 by way of the corresponding bank transceivers. Board transceiver 180 is responsive to board transceiver control circuit 182 from the corresponding CAS, as well as the BDONE and WE signals.

Each of the bank transceivers is enabled by a different one of RAS0-RAS3, and the direction of data flow through the transceiver is determned by the WE signal. The control is generally the same for each memory board.

The present embodiment also contains the capability for automatic memory sizing even if a full complement of memory boards is not available. Each of the memory boards plugs into a corresponding memory board connector in the backplane, but each of the memory board connectors need not contain a memory board.

The memory controller means can include means for obtaining configuration data for memory connectors that do not contain boards. In the preferred embodiment, the lines of memory data bus 65 are precharged by precharge circuit device 66 in memory control logic 50 shown in FIG. 4. Preferably, precharge circuit is a transistor which pulls up to supply voltage Vdd the five lines of memory data bus 65 which transfer the signature data to memory controller 30. If there is no board in one of the connectors when configuration status register 40 attempts to read signature data from an empty connector, it will read in values at the precharged or default condition for memory data bus 65. Those default values correspond to the indication that the memory board has no memory banks.

FIG. 7C shows the timing for signature operations. The corresponding CAS is asserted simultaneously with the SE signal, and memory data bus 65 is precharged before the CAS is asserted. When the corresponding CAS and SE signal are asserted, the signature data are gated to memory data bus 65.

In addition, the memory system can also include error detecting means, coupled to the memory bus, for detecting errors in a memory data. An example of such error detecting means is shown in FIG. 1 as ECC unit 45. ECC unit 45 can perform parity error detection or a Hamming code type of error detection correction. Other types of error detection and correction are also possible.

B. Operation of Automatic Sizing

With an understanding of the functions performed by the different elements shown in FIGS. 1-6, the method of automatic sizing can now be readily understood. Prior to an explanation of that method, however, it would be helpful to understand the general memory access operations of data processing system 10 in more detail.

Generally, CPU 20 makes a read or write request over CPU bus 22 which includes addresses or data. A memory address supplied by CPU 20 in such a memory access operation is sent through latch 34 onto memory controller bus 32, and is an input to comparators 210 of each bank status register circuit. If that memory address is within the address space of the memory on boards 70, 72, 74, and 76 then one comparators 210 will enable its bank hit signal indicating that the address is for a location in the address space of the bank corresponding to that comparator. The enabled bank hit signal then causes RAS and CAS Decoder 230 to assert the one RAS and the one CAS corresponding to that bank. Memory control logic 50, specifically memory address interconnect control 54, then adds clock (phase) timing to form the corresponding RAS and CAS.

In data processing system 10, memory control logic 50 reformats the memory address received from CPU 20 via memory controller bus 32, and sends the reformatted memory address to the memory boards 70, 72, 74, and 76, through memory address interconnect control 54 and memory address lines 310 in ten-bit segments. The first segment contains the row address and the subsequent segment(s) contain(s) the column address. Memory control logic 50 controls the timing, as shown in FIGS. 7A and 7B, so that the RAS occurs first and on its assertion causes the ten-bits on the memory address lines 310 of the row address to be read into the row address buffers 130 for the corresponding bank. The assertion of the subsequent CAS signal causes the next ten bits, which represent the column address on memory address lines 310, to be read into the column address buffer 120 for the designated board. If a multiple word read takes place, then there will be multiple CAS's and multiple column addresses for a single row address.

For a read operation, the corresponding memory bank will produce data from the contents of the location specified by the addresses in row address buffer 130 and column address buffer 120. Those data will be sent through the corresponding bank transceiver (142, 144, 146, or 148) and board transceiver 180 to the memory data bus 65. The bank transceivers will be controlled by the corresponding RAS and the board transceiver will be controlled by the corresponding CAS.

For a write operation, the data to be written will be transferred to memory data bus 65 from CPU 20 via CPU bus 22, through latch 34, memory controller bus 32, and ECC block 45. From memory data bus 65, that data will be provided to the appropriate memory bank through the board transceiver, enabled by the CAS and WE signal, and through the bank transceiver controlled by the WE signal and the corresponding RAS. The CAS will then cause the data to be stored in the contents of the location specified by the addresses in the row and column addresses of the selected memory bank.

One of the advantages of this automatic memory sizing apparatus and method is that it requires very little additional hardware and only one additional backplane signal to implement since it takes advantage of existing memory access hardware and control. In data processing system 10, the RST signal is sent both to CPU 20 and to memory-control 30. CPU 20 uses the RST signal to send a starting address to Boot ROM 25 which contains initialization or bootstrapping procedures, including the automatic memory sizing procedures. In response to the RST signal, memory controller logic 50 deasserts the CAS, RAS, SE, and WE signals, and clears all the bank status register circuits 200, including lock bits in the status configuration registers of those circuits.

Figure 8:
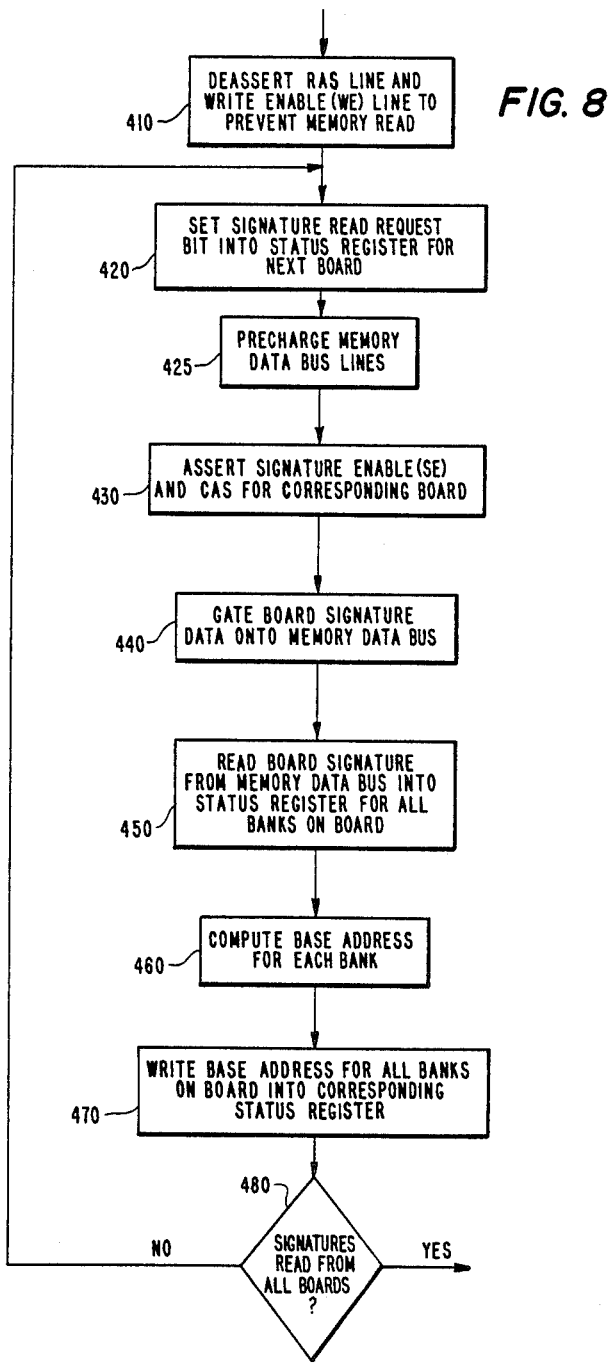
FIG. 8 is a flow diagram explaining the steps of a signature read operation.

FIG. 8 is a flowchart showing the signature read operation of the present invention. The reset operation just described is shown as step 410 in that flowchart. To initiate the automatic memory sizing procedures, the CPU 20 sets the signature read request bit in the status configuration register 202 for one of the banks (Step 420). Next, memory data bus lines 65 are precharged (Step 425).

Memory control logic 50, and specifically microsequencer 52, detects the signature read bit in the word sent to the status configuration register 220 and begins the read signature operations. In fact, in the preferred embodiment, microsequencer 52 does not acknowledge completion of the CPU transfer to the status configuration register until the read signature operation is complete. Memory control logic 50 then asserts the CAS for the board containing that bank and also asserts the SE signal (Step 430). As can be seen from FIG. 5, the assertion of these signals causes the contents of signature signal register 160 in that board, which represent the signature data for that board, to be gated onto the memory data bus 65 through test/sig multiplexer 175, bank multiplexer 170, and board transceiver 180 (Step 440).

The signature data is then written from memory data bus 65 into the status configuration register 202 for each of the banks on the board from which the configuration data was just read (Step 450). CPU 20 then obtains that signature data from the status configuration register 202 and computes the base memory addresses for each of the banks on that same board according to procedures executed from Boot ROM 25 (Step 460). In general, such computation involves maintaining a "next base address" value (which can be initialized to zero), using this value as the base address for bank 0 of the board, and adding the size (1M or 256K) to get the base addresses for the remaining banks and then to set the "next base address" value.

Next, CPU 20 writes base addresses for each bank on that board into the configuration status register 202 corresponding to that bank (Step 470). Then, the CPU determines whether the signatures have been read from all the boards (Step 480). If so, the memory initialization procedure is finished. If not, the procedure is repeated again starting at step 420 for the next board.

The automatic memory sizing thus does not require the addition of significant new hardware or signal lines, and is adapted to the existing memory, hardware. By use of the memory data bus, the RAS's, and the CAS's, the signature or configuration data for each board is obtained with the addition of only a single additional signal, the SE signal. All the other signals used in the method just described are present because they are needed for other memory operations. Furthermore, the only additional function needed on each board to effect the method of this operation, besides some minor control circuitry, is signature register 160.

C. Fast Memory Diagnostics

The present invention speeds up memory diagnostics through simultaneous data comparison of all memory banks with a reference bank. This allows memory testing to proceed more quickly since it takes place in parallel. In general, the testing begins by "broadcast writing," which involves simultaneously writing the same patterns into corresponding locations and all the memory banks. Then the fast memory diagnostic method continues by comparing the contents of a reference memory bank against the contents of corresponding locations in the other memory banks.

The self-testing memory of the present invention therefore comprises means for simultaneously writing the same test patterns into corresponding locations in each of a plurality of memory banks. In the preferred embodiment of the invention, this function is embodied as the broadcast write operation which simultaneously writes a pattern, represented by the data on memory data bus 65, into corresponding locations of all the banks 0-3 on each memory board. In general, this is accomplished by simultaneously asserting the RAS-0-RAS3 as well as the CAS0-CAS3.

In normal memory write operations, only one RAS and one CAS are asserted because the desired memory location resides in only one bank. In the preferred embodiment of the fast memory diagnostic procedure of the present invention, however, asserting all the RAS stores the pattern on memory data bus 65 simultaneously in response to the CAS and WE signal.

The simultaneous assertion of the RAS line is effected by circuitry in memory controller 30. Specifically, in the preferred embodiment of the invention, CPU 20 begins fast memory diagnostics by setting a bit, called the fast diagnostic flag 229, in status register 228 of status register circuit 225 to begin such diagnostics. In response to the setting of this flag, RAS and CAS Decoder 230 (FIG. 2) enables the RAS0-RAS3 EN and CAS0-CAS3 en signals to implement the broadcast write function. As shown in FIG. 2, RAS and CAS decoder 230 receives the fast diagnostic flag 229 directly, although other implementations are within the scope of this invention.

Control logic 50 asserts all RAS's simultaneously and all CAS's simultaneously in response to the simultaneous enabling of RAS EN and CAS EN signals. Memory address interconnect control 54 then adds the appropriate timing, as described above. Then, in response to instructions from Boot ROM 25, CPU 20 issues consecutive write commands to consecutive memory locations causing the same patterns to be written into each location of every bank. The time required to write to every bank, however, is the same as would be required to write to a single bank.

When CPU 20 sets the fast diagnostic flag 229, test set logic 232, shown in FIG. 2, sets certain lines on the memory data bus 65 in response, to that flag. In the preferred embodiment, the lines which include set are lines 0, 10, 20, and 30. The reason for choosing such lines is that they correspond to the preferred memory architecture. In that architecture, memory data bus 65 is 39 bits wide to accommodate a simultaneous transfer of all 39 memory bits. In the preferred implementation, each memory board 70, 72, 74 and 76 comprises four ten-bit wide slices, so memory data bus 65 comprises four sets of ten (the last is actually nine) conductors, each set being connected to a different "slice." For every ten-bit slice, the lowest order bit (i.e., bits 0, 10, 20 and 30) is used to indicate a test. When these lines are asserted, the memory board is in a test mode. Memory board control logic circuit 190 senses the assertion of these lines and forms the TEST signal mentioned above. This TEST signal is then used by memory board 70 to implement fast memory diagnostic procedures.

In further accordance with the present invention, the self-testing, memory also includes means for simultaneously comparing the contents of each the locations at one of the memory banks with contents at corresponding locations of each of the other memory banks. Such means can include means for reading out the contents of a selected one of the memory banks. In the preferred embodiment of the present invention, the selected memory bank is bank 0 on board 1. Board 1 is determined using a signal BDLOCLI on the backplane. BDLOCLI is generated at CPU board 15. The first memory board 70 (i.e., the one closest to CPU board 15) receives the BDLOCLI signal as an input of an initial location sensor 195 (FIG. 5). That input is pulled up to Vdd by resistor 198. If initial location sensor 195 determines that the BDLOCLI is at the Vss level, it asserts a BDONE or "board one" signal which identifies that board as being the closest memory board to CPU board 15. The closest memory board to CPU 20 also stops the BDLOCLI signal from propagating further. Thus, the BDLOCLI signal to all but the closest memory board to CPU 20 is floating. The resistors 198 on those other memory boards will pull the BDLOCLI signal up to Vdd and their initial location sensor will not assert their BDONE signals.

In the preferred embodiment of this invention, means for reading a selected one of the memory banks includes bank multiplexer control circuit 172. When board 70 senses from control logic 190's enabling of the TEST signal that board 70 is in the test mode, bank multiplexer control circuit 172 enables bank multiplexer 170 to select the designated contents of bank 0 during a memory read, and transceiver control circuit 182 causes board transceiver 180 to gate these contents onto the memory data bus 65. The designated contents are determined by the memory address lines 310 according to the addresses from CPU 20.

The simultaneous comparing means of the present invention can include means for storing the contents of the one memory board into a first latch. During the read operation in which the contents of of the designated location of bank 0 are transferred to memory data bus 65, each memory board 70, 72, 74 and 76 receives those contents through board transceiver 180 and latches then into a memory latch 500 during the deactivation of the associated CAS.

The simultaneous comparing means of the present invention can also include means for simultaneously reading the corresponding contents of the other memory banks into a second latch. During that same read operation, the RAS remain activated, and cause the contents at the corresponding locations of each of the banks 100, 102, 104 and 106 to be output through their respective bank transceivers 142, 144, 146 and 148 into several bank latches latches 510, 515, 520, and 525 corresponding, respectively, to banks 100, 102, 104, and 106. The contents are stored during the deassertion of the CAS signal simultaneously with the storage of the contents into memory latch 500.

In the preferred embodiment, the simultaneous comparing means also includes comparators, such as comparators 530, 535, 540, and 560, for comparing the contents of the selected memory bank, for example the contents of bank 0 of board 1 in latch 500, with contents of the corresponding locations of the other memory banks, for example the contents of latches 510, 515, 520, and 525. As shown in FIG. 5, each of the comparators 530, 535, 540 and 545 has one input receiving the output of a corresponding bank latch 510, 515, 520, or 525, respectively, and another input connected to the output of memory latch 500.

Each of the comparators 530, 535, 540 and 545 preferably produces an output at a first state, such as a "1," if the contents of the memory latch 500 do not match the contents of the respective bank latch 510, 515, 520, or 525. Otherwise, the comparators 530, 535, 540, and 545 produce a "0" output at a second state. The outputs of comparators 530, 535, 540 and 545 are all inputs to an OR gate 550. If any of the inputs to OR gate 550 are at the first state, e.g., a "1," then the output of OR gate 550 is enabled, e.g., also a "1".

In accordance with the present invention, the self-testing memory also includes means for recording as errors occurrences when the contents at the locations of the selected memory bank differ from the contents at corresponding locations of any of the other memory banks. In the preferred embodiment of this invention, a seven-bit counter 560, shown in FIG. 5, has a data input connected to the output of OR gate 550 and has a clock input connected to receive the associated CAS after it passes through a delay circuit 555. Delay circuit 555 allows for propagation delay through the latches 500, 510, 515, 520, and 525, the comparators 530, 535, 540 and 545, and OR gate 550. If the output of OR gate 550 is a "1," then the CAS deassertion will cause the counter to increment. If the output of OR gate 550 is a "0," then counter 560 will not increment.

In this manner, counter 560 counts the number of times that the contents of one of the bank latches 510, 515, 520 or 525, and therefore, the contents of the corresponding memory locations stored in those latches, differ from the contents of memory latch 500, which contains the contents at the corresponding location of bank 0 of board 1. In the preferred embodiment, counter 560 is only a seven-bit counter. If there are more than $2^7$ errors, then an overflow (OV) bit is set.

In the preferred embodiment of this invention, memory board 70 is implemented as a ten-bit slice, and there is one counter for each slice. Thus, each board has four (4) seven-bit counters recording the number of memory events.

In the preferred implementation, it is difficult to transmit the outputs of the four counters (i.e., all 40 bits) to CPU 20 because CPU bus 22 is preferably 32 bits wide. Thus, the contents of one of the counters, which would be on the highest order ten lines of memory data bus 65, are stored in register 227 and read from that register by CPU 20 in a separate memory read instruction.

The output of counter 560 is an input into the test/sig multiplexer 175 and can be output onto memory data bus 65 for input into CPU 10 at the end of the testing procedure. Preferably, this occurs during the first read operation after the diagnostic testing operation. Specifically, when CPU 20 finishes a test, it changes the contents of register 228 which deasserts lines 0, 10, 20, and 30 of memory data bus 65. In response, test control logic 190 deasserts the TEST signal and test/sig multiplexer 175 and bank multiplexer 170 gate the outputs of counter 560 to board transceiver 180, ignoring the RAS's during the first read operation following the test. During the CAS generated for that first read operation, the board transceiver 180 gates the contents of the counter to memory data bus 65.

The output of counter 560 is cleared, in the preferred embodiment, when the SE signal is activated during a signature read.

D. Fast Memory Diagnostic Method

With the elements described, a preferred embodiment of the method for performing a fast diagnostic test of this invention can be understood with the aid of the flow diagram in FIG. 9, which illustrates a preferred method of the memory test procedure. The first step is to reset error counter 560 (Step 600). Preferably, this is done during a signature read, although such timing is discretionary and not required to operate the memory test of this invention.

In the next step, the test pattern is written simultaneously into the locations in all of the memory banks (Step 610). As previously indicated, this is done by the simultaneous assertion of all the RAS and CAS as CPU 20 supplies the memory test pattern and addresses for the different locations for one of the banks.

After the pattern is written into all of the banks, the contents of bank 0 (designated 100 in FIG. 5) of board 1 (designated board 70 in FIG. 1) are read out onto memory data bus 65 (Step 620). As indicated above, this occurs because the BDONE signal causes the bank multiplexer control 170 to select the contents from bank 0 through transceiver 142, and because the BDONE signal into transceiver control 182 also causes board transceiver 180 to gate the output of bank multiplexer 170 onto the memory data bus 65. If theBDONE signal is not asserted, as it would not be for boards 72, 74 and 76, then neither the bank multiplexer 170 nor the board transceiver 180 would be enabled. This ensures that only the contents of bank 0 of board 1 are gated onto the memory data bus 65. This gating occurs while the corresponding CAS signal is asserted.

CPU 20 then performs its own analysis on the contents of bank 0, such as comparing those contents to the pattern which was stored (630). Such analysis, however, need proceed only for one bank.

Substantially simultaneously, each board stores the contents of bank 0 in board 1 into the corresponding memory latch 500 and stores the contents from corresponding locations of the other banks into bank latches 510, 515, 520, and 525 (Step 640). Preferably, this storing occurs when the CAS is deasserted. The CAS into each board causes the board transceiver to receive the memory data bus contents and present them at the input to memory latch 500. Thus, all the boards simultaneously latch the signals from the memory data bus 65 when the corresponding CAS signal is deasserted, and also latch the other banks' contents into the bank latches at the same time. FIG. 7D shows the timing for the fast memory diagnostic when the data is read from the memory banks.

After the contents of the selected bank and the contents of the other banks for the corresponding locations are latched, each bank's contents are simultaneously compared with the contents of the selected bank (Step 650). As shown in FIG. 5, such comparison uses comparators 530, 535, 540, and 545 for the contents of banks 0 through 3, respectively. Comparators 530, 535, 540, and 545 all operate simultaneously.

In the next step, the error counter is incremented whenever the contents of the selected memory bank and the contents of the corresponding locations in any of the other banks do not match (Step 660). As indicated previously, comparators 530, 535, 540, and 545 each produce a "1" when their inputs are not equal. When this happens, OR gate 550 is also enabled and enables the data input to counter 560. When counter 560 receives a clock signal, it increments. The clock signal is provided from the corresponding CAS after being delayed through delay element 555. The delay element allows time for the signals to propagate to the data input of the counter.

Next, a determination is made whether the contents of the banks have been read out entirely (Step 670). If not, then Step 620 is repeated for the next memory location within a bank. If so, then the contents of the error counter are output (Step 680). In the preferred embodiment of the invention, the contents of counter 560 are gated through test/sig multiplexer 175, bank multiplexer 170, and board transceiver 180 when the first nontest mode read operation after the fast memory diagnostic occurs for the selected board. At the end of the fast memory diagnostic, CPU 20 resets the memory diagnostic flag which causes test set circuit 232 to deassert lines 0, 10, 20, and 30 of memory data bus 65. When test control logic circuit 190 determines that the lines 0, 10, 20, and 30 are no longer asserted, thus indicating the end of a current test, the bank multiplexer control 172 and the test/sig multiplexer 175 are configured to gate the contents of the counter 560 to board transceiver 180, and eventually to memory data bus 65, at the next read operation.

CPU 20 can then obtain the counter value and determine whether to repeat this procedure with another pattern (Step 690). If so, then the procedure is repeated (Step 600). If not, then the procedure is over.

Thus, the fast memory diagnostic of this invention thus tests memories in much less time than conventional methods and also requires little additional hardware.

It will be apparent to those skilled in the art that further modifications and variations can be made in the present invention. The invention in its broader aspects, therefore, is not limited to the specific details and illustrative examples shown and described. Accordingly, departure may be made from such details without departing from the spirit or scope of the general inventive concept.

What is claimed is:

1. A self-testing memory composed of a plurality of independent memory banks and comprising:
   means for simultaneously writing the same test patterns into corresponding locations in each of said plurality of memory banks;
   means for accessing the contents at corresponding locations in each of said memory banks;
   means for selecting one of said memory banks;
   means for simultaneously comparing the contents at the locations of said selected one of said memory banks with the contents at corresponding locations of the others of said memory banks; and
   means for recording, as errors, occurrences when the contents at the locations of said selected memroy banks are different from the contents at the corresponding locations of any of the others of said memory banks.

2. The self-testing memory of claim 1 wherein all of said memory banks reside on a single memory board.

3. The self-testing memory of claim 1 further including a plurality of memory board each including at least one of said plurality of memory banks.

4. The self-testing memory of claim 1 further including:
   a first latch for holding the contents of said selected memory banks; and
   a second latch for holding the contents of each of the others of said memory banks.

5. The self-testing memory of claim 4 wherein said sumultaneous comparing means includes a comparator coupled to said first and second latches.

6. The self-testing memory of claim 5 further including an OR gate coupled to said comparator.

7. The self-testing memory of claim 1 further including counting means for incrementing a count value each time the contents of the locations of said selected mmeory bank are different from the contents at the corresponding locations of any of the others of said memory banks.

8. The self-testing memory of claim 7 further including means for outputting the count value from said counting means.

9. A data processing system including a self-testing memory composed of a plurality of independent memory banks, said data processing system comprising:
   means for simultaneously writing the same test patterns into corresponding locations in each of said plurality of memory banks;
   means for accessing the contents at corresponding locations in each of said memory banks;
   means for selecting one of said memory banks;
   means, coupled to said memory, for examining the contents from said selected one of said memory banks to evaluate the operation of said memory;
   means for simultaneously comapring the contents at the locations of said selected one of said memory banks with the contents at corresponding locations of each of the others of said memory banks; and
   means for recording, as errors, occurrences when the contents at the locations of said selected memory bank are different from the contents at the corresponding locations of any of the others of said memory banks.

10. The data processing system of claim 9 further including:
    a first latch for holding the contents of said selected one of said memory banks;
    a second latch for holding the contents of each of the others of said memory banks; and
    a comparator coupled to said first and second latches.

11. A self-testing memory system adapted to be coupled to a plurality of independent memory banks and comprising:
    means for simultaneously writing the same test patterns into corresponding locations in each of said plurality of memory banks;
    means for accessing the contents at corresponding locations in each of said memory banks;
    means for selecting one of said memory banks;
    means for simultaneously comparing the contents at the locations of said selected one of said memory banks with the contents at corresponding locations of each of the others of said memory banks; and
    means for recording, as errors, occurrences when the contents at the locations of said selected memory banks are different from the contents at the corresponding locations of any of the others of said memory banks.

12. The self-testing memory system of claim 11 wherein all of said memory banks reside on a single memory board.

13. The self-testing memory system of claim 11 further including a plurality of memory boards each including at least one of said plurality of memory banks.

14. The self-testing memory system of claim 11 further including:
    a first latch for holding the contents of said selected memory bank; and
    a second latch for holding the contents of each of the others of said memory banks.

15. The self-testing memory system of claim 14 wherein said simultaneous comparing means includes a comparator coupled to said first and second latches.

16. The self-testing memory system of claim 15 further including an OR gate coupled to said comparator.

17. The selof-testing memory system of claim 11 further including counting means for incrementing a count value each time the contents at the locations of said selected memory bank are different from the contents at the corresponding locations of any of the others of said memory banks.

18. The self-testing memory system of claim 11 further including means, coupled to said memory system, for examining the contents from said selected memory banks to evaluate the operation of said memory system.

19. A self-testing memory system comprising:
    a memory bus;

at least one memory board coupled to said memory bus and each including a plurality of independent banks of memory, transceiver circuits, each associated with a different one of said banks of memory, for causing data to be written into a selected location of the associated memory bank in response to a write signal and a corresponding one of a plurality of bank select signals, a location detector circuit for producing a selected board signal if the board is in a selected board location, a multiplexer, coupled to said location detector circuit and having inputs coupled to each of said banks on the memory board and an output coupled to said memory bus, for transferring the contents of a predetermined one of said banks to the memory bus if said location detector circuit produces said selected board signal, a board latch for storing the contents from the predetermined one of said banks received from the memory bus, bank latches for storing corresponding contents of each of said banks on the memory board, a comparator having inputs coupled to said board latch and each of said bank latches, and a counter having an input connected to the output of said comparator; and a memory control circuit, coupled to each of said memory boards, for issuing said bank selected signals and said wirite signal, said memory control circuit including a register for holding a test flag which is set when a fast memory diagnostic test is to be performed, and a bank selected circuit for enabling all of said bank select signals simultaneously when said test flag is set.

20. A data processing system with self-testing memory capabilities comprising:

a memory bus;

at least one memory board coupled to said memory bus and each including a plurality of independently banks of memory, transceiver circuits, each associated with a different one of said banks of memory, for causing data to be written into a selected location of the associated memory banks in response to a write signal and a corresponding one of a plurality of bank select signals, a location detector circuit for producing a selected board signal if the board is in a selected board location, a muliplexer, coupled to said location detector circuit and having inputs coupled to each of said banks on the memory board and an output coupled to said memory bus, for transferring the contents of a predetermined one of said banks to the memory bus if said location detector circuit produces said selected board signal, a board latch for storing the contents from the predetermined one of said banks received from the memory bus, bank latches for storing corresponding contents of each of said banks on the memory board, a comparator having inputs coupled to said board latch and each of said bank latches, and a counter having an input connected to the output of said comparator;

a memory control circuit, coupled to each of said memory boards, for issuing said bank select signals and said write signal, said memory control circuit including a register for holding a test flag which is set when a fast memory diagnostic test is to be performed, and a bank select circuit for enabling all of said bank select signals simultaneously when said test flag is set; and a central processing unit, coupled to said memory bus, for setting said test flag and for evaluating the contents from said predetermined memory bank.

21. A method for testing a memory composed of a plurality of independent memory banks, the method comprising the steps of:

writing the same test patterns into corresponding locations of said memory banks simultaneously;

accessing the contents at corresponding locations in each of said memory banks;

selecting one of said memory banks;

comparing the contents at the locations of said selected one of said memory banks with the contents at corresponding locations of each of the others of said memory banks simultaneously; and recording, as errors, any differences in the contents at locations in said selected memory bank and the contents of corresponding locations of any of the others of said memory banks.

22. The method of 21 wherein said recording step includes the substep of counting the number of times that the contents at locations of said selected memory bank are different from the contents at corresponding locations of the other of said memory banks.

23. The method of 21 further including the step of repeating the writing and comparing steps with a plurality of different test patterns.

24. The method of claim 21 further including the steps of reading the contents of said selected memory bank; and comparing the contents of said selected memory bank with the test patterns.

25. A method for testing a memory composed of a plurality of independent memory banks, the method comprising the steps of:

writing the same test patterns into corresponding locations of said memory banks simultaneously by simultaneously energizing memory select lines for each of said memory banks;

selecting one of said memory banks;

reading the contents at the locations of said selected one of said memory banks;

storing in a board latch the contents of the locations of said selected one of said memory banks;

reading the contents of the others of said memory banks simultaneously;

storing in bank latches the contents of the others of said banks simultaneously;

comparing the stored contents at locations of said selected memory bank with the stored contents at corresponding locations of each of the others of said memory banks simultaneously; and recording, as errors, any occurrences when the stored contents at locations of said one memory bank differ from the stored contents of any of said others of said memory banks.

26. The method of claim 25 further including the steps of reading the contents of said selected memory bank; and comparing the contents of said one memory bank with the test patterns.

* * * * *

UNITED STATES PATENT AND TRADEMARK OFFICE
CERTIFICATE OF CORRECTION

PATENT NO. : 4,782,486
DATED : November 1, 1988
INVENTOR(S) : Jesse B. Lipcon, Barry A. Maskas and David K. Morgan It is certified that error appears in the above-identified patent and that said Letters Patent is hereby corrected as shown below:

Claim 1, column 17, line 22, "memroy" should be --memory--.

Claim 7, column 17, line 54, "mmeroy" should be --memory--.

Claim 9, column 18, line 5, "comapring" should be --comparing--.

Claim 17, column 17, line 57, "selof-testing" should be --self-testing--.

Claim 19, column 19, line 29, "wirite" should be --write--.

Signed and Sealed this

Sixth Day of June, 1989

*Attest:*

DONALD J. QUIGG

*Attesting Officer*  Commissioner of Patents and Trademarks